(12) United States Patent
Pirovano et al.

(10) Patent No.: US 8,283,234 B2
(45) Date of Patent: Oct. 9, 2012

(54) MEMORY INCLUDING BIPOLAR JUNCTION TRANSISTOR SELECT DEVICES

(75) Inventors: Agostino Pirovano, Corbetta (IT); Fabio Pellizzer, Follina (IT)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 13/009,932

(22) Filed: Jan. 20, 2011

(65) Prior Publication Data

US 2011/0111572 A1    May 12, 2011

Related U.S. Application Data

(62) Division of application No. 11/788,909, filed on Apr. 23, 2007, now Pat. No. 7,898,848.

(51) Int. Cl.
*H01L 21/8222*    (2006.01)
*H01L 21/331*    (2006.01)
(52) U.S. Cl. ......... 438/311; 438/309; 438/323; 438/338
(58) Field of Classification Search .................. 438/309, 438/311, 323, 338
See application file for complete search history.

(56) References Cited

U.S. PATENT DOCUMENTS

| 5,929,477 | A | * | 7/1999 | McAllister Burns, Jr. et al. | 257/306 |
| 6,440,801 | B1 | * | 8/2002 | Furukawa et al. | 438/272 |
| 7,326,611 | B2 | * | 2/2008 | Forbes | 438/242 |
| 2006/0001053 | A1 | * | 1/2006 | Wang | 257/214 |

\* cited by examiner

*Primary Examiner* — Luan C Thai
(74) *Attorney, Agent, or Firm* — Trop, Pruner & Hu, P.C.

(57) ABSTRACT

An array is formed by a plurality of cells, wherein each cell is formed by a bipolar junction selection transistor having a first, a second, and a control region. The cell includes a common region, forming the second regions of the selection transistors, and a plurality of shared control regions overlying the common region. Each shared control region forms the control regions of a plurality of adjacent selection transistors and accommodates the first regions of the plurality of adjacent selection transistors as well as contact portions of the shared control region. Blocks of adjacent selection transistors of the plurality of selection transistors share a contact portion and the first regions of a block of adjacent selection transistors are arranged along the shared control region between two contact portions. A plurality of biasing structures are formed between pairs of first regions of adjacent selection transistors, for modifying a charge distribution in the shared control region below the biasing structures.

6 Claims, 8 Drawing Sheets

MEMORY INCLUDING BIPOLAR JUNCTION TRANSISTOR SELECT DEVICES

CROSS-REFERENCE TO RELATED APPLICATIONS

This application is a divisional of U.S. patent application Ser. No. 11/788,909, filed on Apr. 23, 2007 now U.S. Pat. No. 7,898,848.

BACKGROUND

This relates to a memory including bipolar junction transistor select devices.

Phase change memories are formed by memory cells connected at the intersections of bitlines and wordlines and comprising each a memory element and a selection element.

Each memory element comprises a phase change region made of a phase change material, i.e., a material that may be electrically switched between a generally amorphous and a generally crystalline state across the entire spectrum between completely amorphous and completely crystalline states. Typical materials suitable for such an application include various chalcogenide elements. The state of the phase change materials is non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Select devices, access devices, or select elements may be formed according to different technologies, for example they can be implemented by diodes, by MOS transistors or bipolar transistors.

The collector region of a bipolar select device is formed by a buried, shared region of the substrate, overlaid by a shared base region. An emitter region and a base contact region are formed in the base region for each memory cell. Each emitter region is then connected to an own memory element, in turn connected to a bitline. The base contact is connected to a wordline through plugs extending in an insulating layer overlying the substrate. The memory cells that are adjacent in the direction of the rows of the memory array are connected to a same wordline. The memory cells that are adjacent in the direction of the columns of the memory array are connected to a same bitline.

BRIEF DESCRIPTION OF THE DRAWINGS

For the understanding of the present invention, preferred embodiments thereof are now described, purely as non-limitative examples, with reference to the enclosed drawings, wherein.

DETAILED DESCRIPTION

Figure 1:
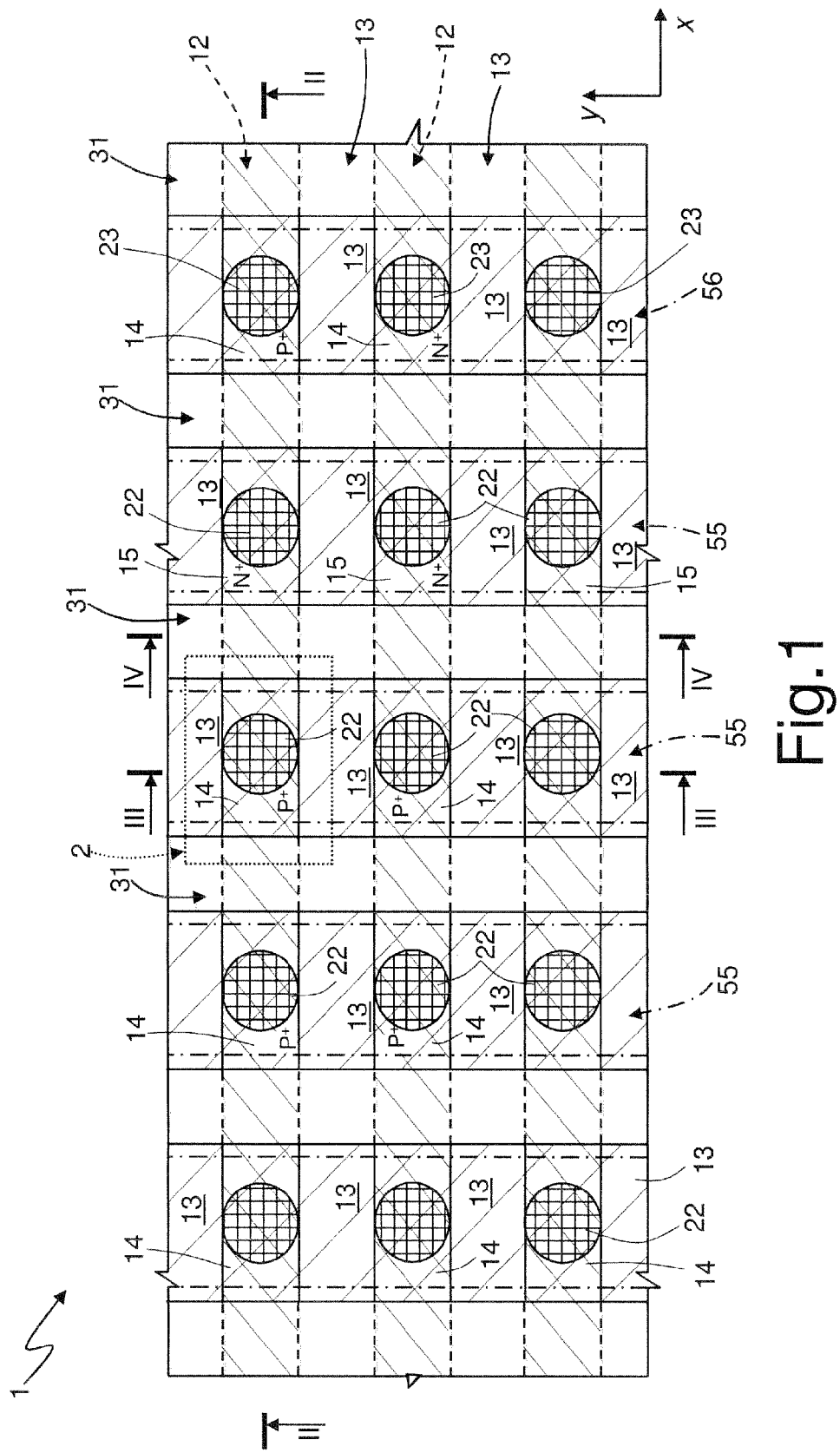
FIG. 1 shows the layout of a first embodiment of the present invention.

FIGS. 1-4 show an embodiment of the invention wherein a polysilicon region is formed between adjacent emitter regions of a bipolar junction select device to bias the underlying shared base region and thus reduce the resistance of the shared base region during programming and reading.

An array 1 of memory cells 2 is formed in a body 10 of monocrystalline semiconductor material including a heavily doped P-type substrate 6, a P-type subcollector region 7, a P-type common collector region 11 having a lower doping level than the subcollector region 7, and shared N-type base regions 12.

Figure 3:
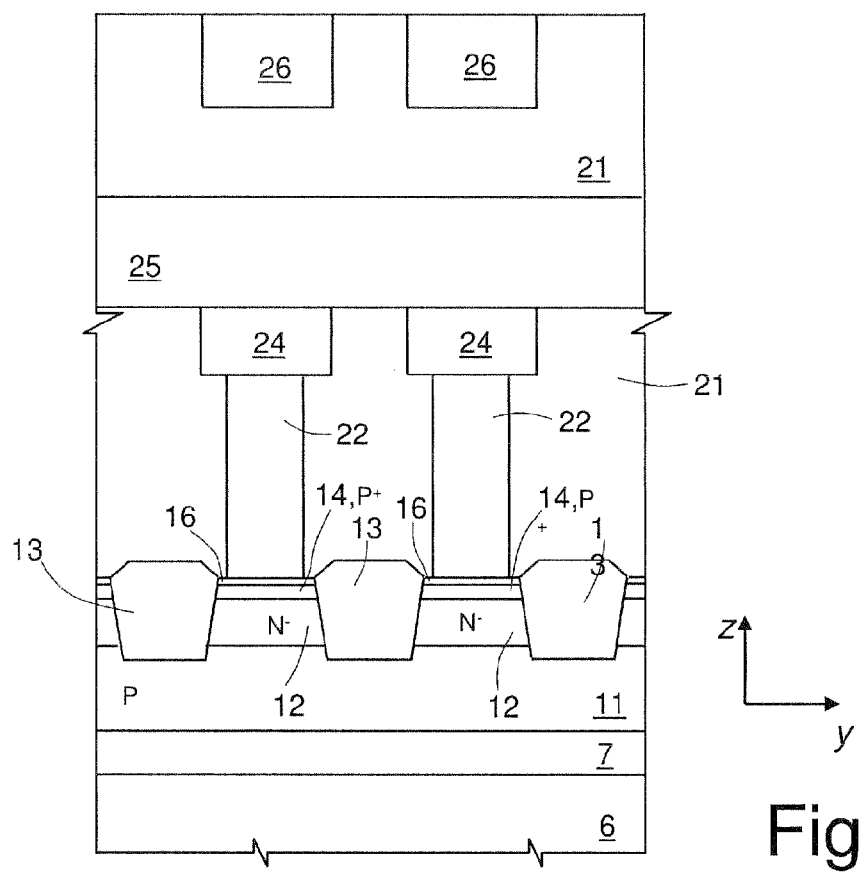
FIG. 3 shows a cross-section, taken along line III-III, of the embodiment of FIG. 1.
Figure 4:
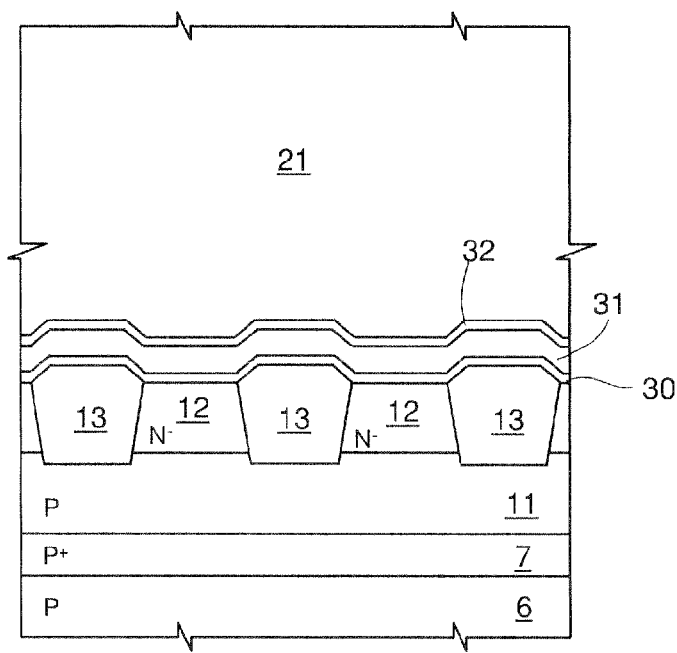
FIG. 4 shows a cross-section, taken along line IV-IV, of the embodiment of FIG. 1.

The subcollector region 7 extends above the substrate 6 in an epitaxial layer which also accommodates the common collector region 11, and the shared base regions 12. The shared base regions 12 are formed in active areas of the array 1, delimited and electrically insulated from each other by field oxide regions 13 (FIGS. 3 and 4). Thus, the shared base regions 12 are strip-shaped and extend parallel to each other along a first direction (X-direction).

Each base region 12 accommodates a plurality of $P^+$-type emitter regions 14 grouped in clusters or blocks of N adjacent emitter regions 14 (e.g., of eight or sixteen emitter regions 14) in one embodiment. An $N^+$-type base contact region 15 is accommodated in the base region 12 of each block of emitter regions 14. An emitter region 14, together with the respective base region 12, the common collector region 11 and the base contact 15 of the block, forms a bipolar PNP select transistor 50. Thus, the select transistors 50 comprising emitter regions 14 of a same block are arranged adjacent to each other in the row or x direction and share the same base contact 15.

Silicide regions 16 may be formed on the emitter regions 14 and on the base contact regions 15, to reduce resistivity.

Biasing structures 20 are formed on top of the body 10, between adjacent emitter regions 14 as well as between the emitter regions 14 and the base contact 15. Each biasing structure 20 may include a gate oxide strip 30, a polysilicon strip 31 on the gate oxide strip 30, a suicide strip 32 on the polysilicon strip 31, and spacers 33 on the sides of the polysilicon strip 31. The spacers 33 are formed (e.g., of nitride) and the polysilicon strips 31 are biased through a contact 38, shown schematically in FIG. 2.

A dielectric region 21 extends over the body 10 and the biasing structures 20. The dielectric region 21 may be formed by subsequently deposited layers to form the various regions therein and to include different materials.

First and second contacts 22, 23 extend through the dielectric region 21. The contacts 22, 23 may be tungsten, covered laterally and on bottom with a barrier material (for example, Ti/TiN) (not shown).

The first contacts 22 extend each from an emitter region 14 to a storage element 24, of chalcogenic material. First metal lines 25, forming bit lines, extend along a second direction (Y-direction), thus transversely to the base regions 12 (active area strips). Each first metal line 25 is in contact with the storage elements 24 that are aligned in the Y direction, as shown in FIG. 3. The first metal lines 25 may be formed in a first metal level.

Figure 2:
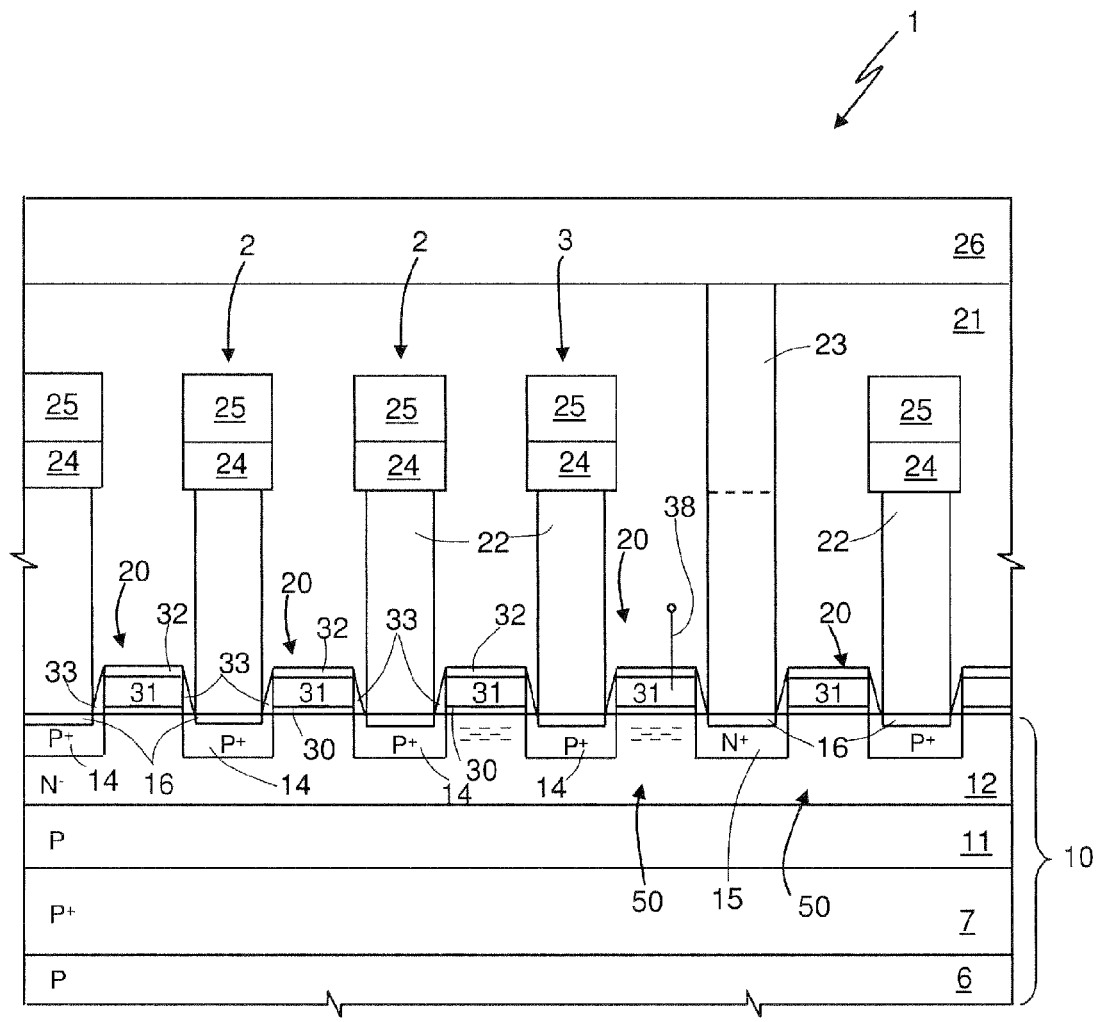
FIG. 2 shows a cross-section, taken along line II-II, of the embodiment of FIG. 1.

The second contacts 23 are higher than the first contacts 22 and extend each from a base contact region 15 to second metal lines 26. The second metal lines 26, forming word lines, extend along the first direction (X-direction), parallel to the base regions 12 and perpendicular to the first metal lines 25. Each second metal line 26 is in contact with the second contacts 23 that are aligned in the X direction, as shown in FIG. 2. The second metal lines 26 may be formed in a second metal level.

Thus, each selection transistor 50 has its emitter region 14 connected to a storage element 24 to form a memory cell 2 which can be selected by biasing the first metal line 25 and the second metal line 26 connected thereto. Here, the resulting cell size may be determined substantially by the emitter region 14 and the respective polysilicon strip 31 ($6F^2$, where F is the minimum geometry that defines the memory cell to be formed) plus the size of the shared base contact 15 ($6F^2/N$). With the number of emitter regions 14 per block, (N), sufficiently large (e.g., eight or sixteen), the shared base contact 15 area may be negligible.

To manufacture the array 1 of FIGS. 1-4, in one embodiment, first the field oxide regions 13 are formed in the semiconductor body 10. Then subcollector region 7, the common collector region 11, and the base regions 12 are implanted in sequence.

Thereafter, a gate oxide layer and a polysilicon layer are deposited and defined, to form the gate oxide strips 30 and the polysilicon strips 31, extending perpendicularly to the field oxide regions 13. Then, the spacers 33 are formed and the emitter regions 14 and the base contact regions 15 are implanted using respective masks. In particular, the emitter mask (indicated by dash-and-dot lines 55 in FIG. 1) includes a plurality of elongated windows extending parallel to and between pairs of adjacent gate strips to implant blocks of emitter regions 14 at every Nth (e.g. eight) adjacent emitter window, no emitter implant is carried out, and instead the base contact regions 15 are implanted (base contact mask 56 in FIG. 1). Thereafter, silicide regions 16, 33 are formed.

Then, the body 10 is covered by a first layer of insulating material, forming the bottom portion of the dielectric region 21. Vias are formed in the first layer of insulting material. The vias are filled with a barrier layer (e.g., Ti/TiN), and with tungsten.

The process continues by forming the chalcogenic storage elements 24, the first metal lines 25, the upper portion of the dielectric region 21, the upper portion of the second contacts 23 and the second metal lines 26 to obtain the structure shown in FIGS. 2-4.

In use, when a selection transistor 50 is selected for programming or reading the associated storage element 24, the associated bitline (first metal line 25) and the associated wordline (second metal line 26) are biased. To reduce the base resistance, the polysilicon strips 31 of the same block are biased with a positive voltage to accumulate negative charge on the portion of the base region 12 below the polysilicon strips 31. Thus, the resistance along the base region 12 between the selected base contact 15 and the selected emitter region 14 is reduced.

Thereby, the selected selection transistor 50 switches on without increasing the voltage drop along the base region 12, in some embodiments. For example, for programming, the selected bitline may be grounded. The non-selected bitlines are biased to a low positive voltage (e.g., 0.2-0.3 V), the selected wordline is biased at Vcc (or the maximum voltage in the end device, e.g., 3 V), and the polysilicon strip 31 is biased at a supply voltage Vcc. For reading, the bitline 25 is biased at Vcc, the wordline 26 is grounded and polysilicon strip 31 is biased at Vcc.

Figure 5:
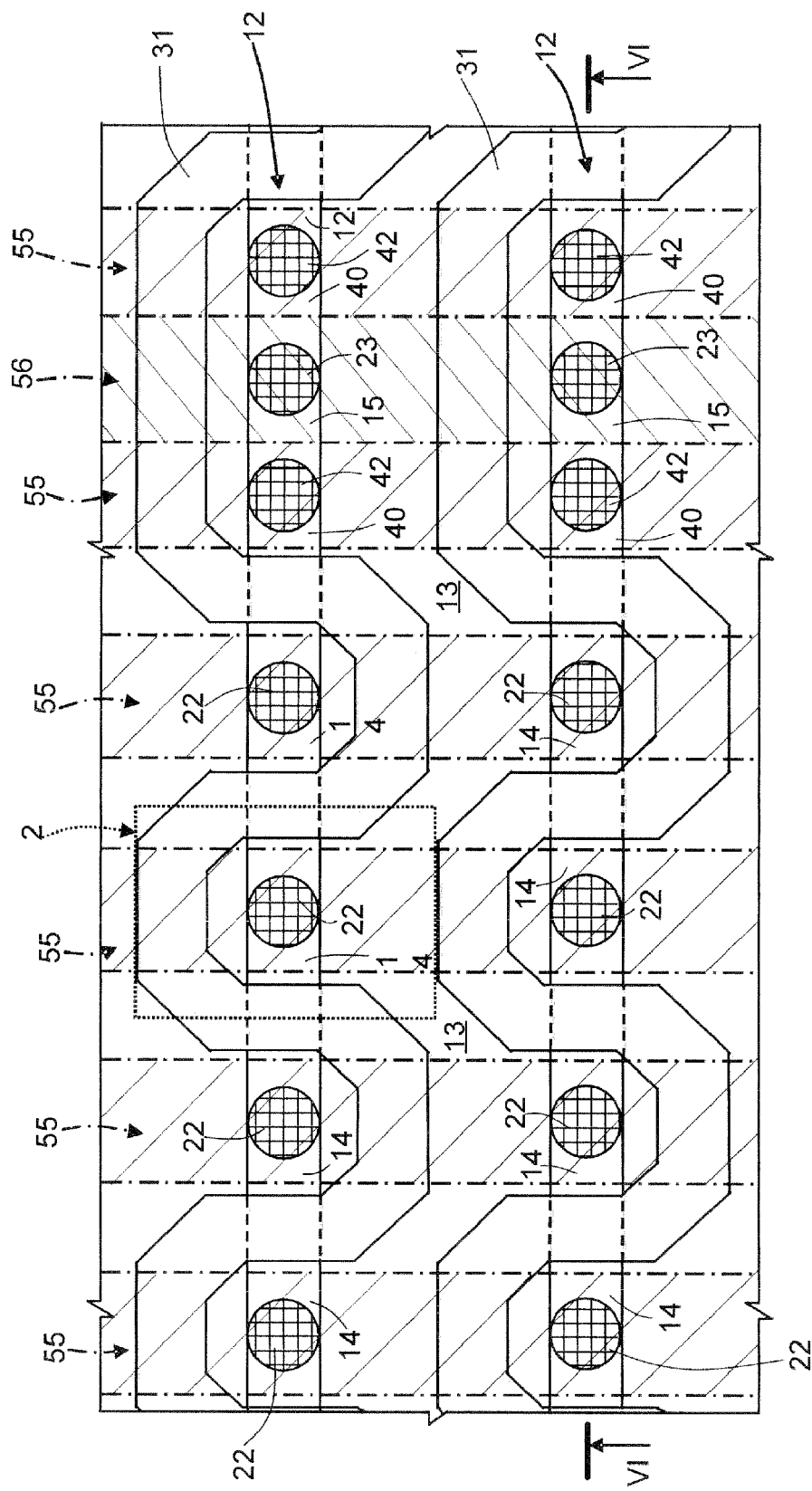
FIG. 5 shows the layout of a second embodiment of the present invention.
Figure 6:
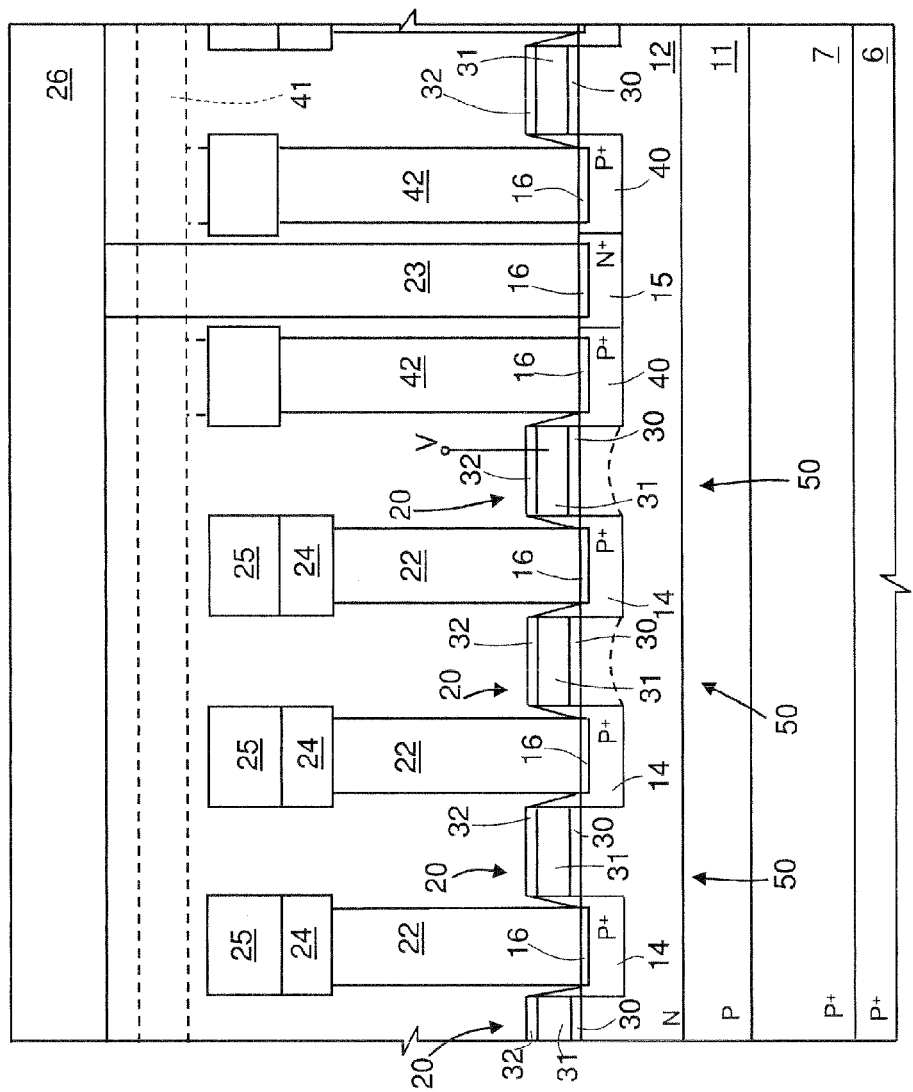
FIG. 6 shows a cross-section, taken along line VI-VI, of the embodiment of FIG. 5.

FIGS. 5-8 show embodiments wherein the polysilicon strips 31 are generally parallel to the base regions 12. Therefore, the polysilicon strips may operate as MOS transistors during reading to deplete the portions of the base region 12 between adjacent emitter regions 14 as far as the selected selection transistor. To this end, as shown in FIG. 6, two P+ type biasing regions 40 are formed on the two sides of each base contact region 15. The biasing regions 40 are connected to their own biasing line 41 extending parallel to the respective wordline 26 (shown in FIG. 6 below the wordline 26 only for illustrative purpose) and connected through third contact lines 42 of suitable shape (for example, including an intermediate connecting portion formed in the first metal level).

In particular, in FIG. 5, the polysilicon strips 31 have a zigzag pattern around the first contacts 22. Here, the emitter mask 55 is used to also form the biasing regions 40 and the base contact mask 56 has a window contiguous to the windows of the emitter mask 55 where the biasing regions 40 are to be formed. With this configuration, the cell size is $12F^2$.

Figure 7:
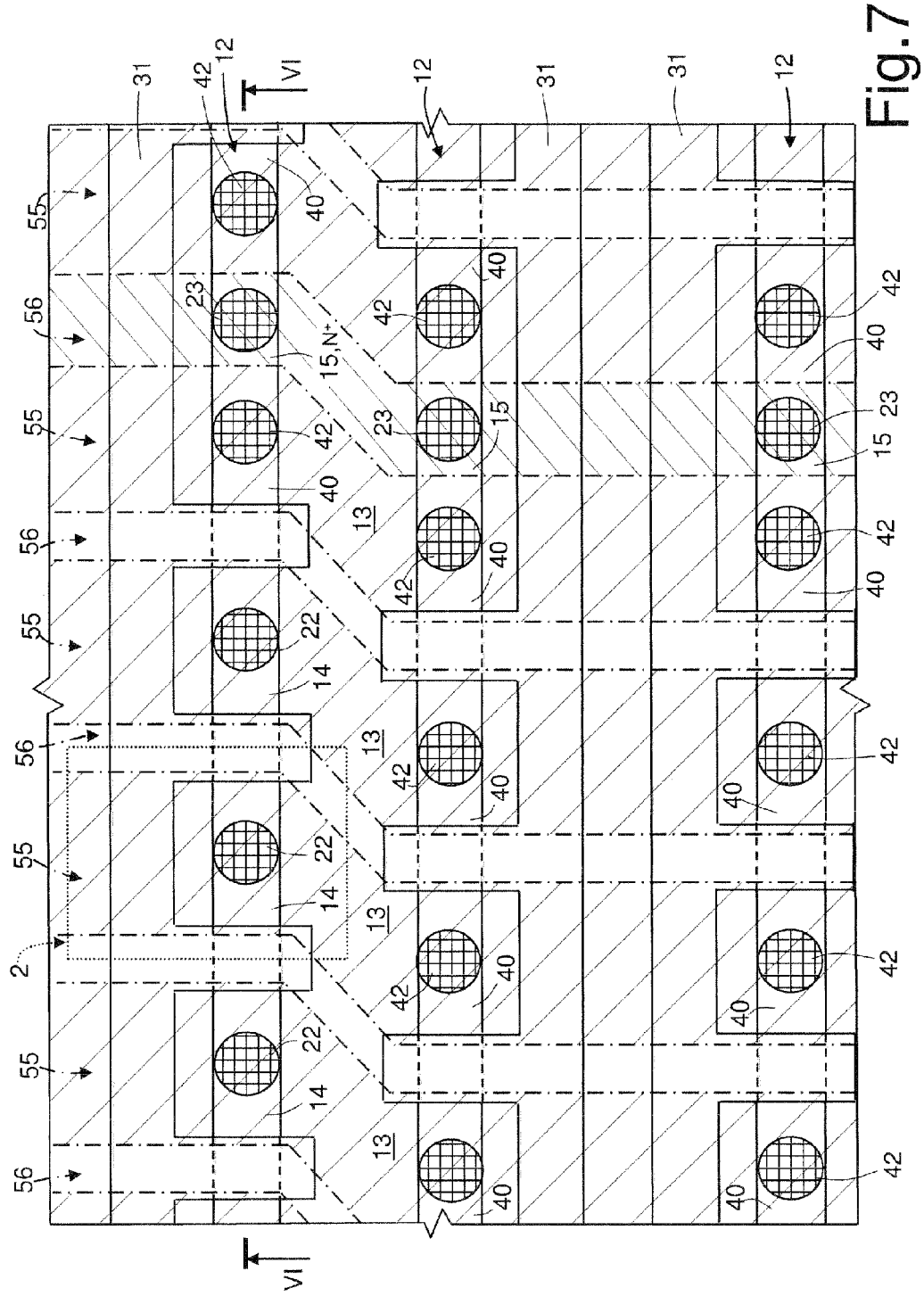
FIGS. 7 and 8 show the layouts of further embodiments of the present invention.

In FIG. 7, each polysilicon strip 31 includes a rectilinear portion 36 and protruding fingers 37. Pairs of polysilicon strips 31 have adjacent rectilinear portions 36, arranged back-to-back, with the respective fingers 37 protruding in opposite directions to intersect the active areas (base regions 12). Each pair of polysilicon strips 31 is laterally offset with respect to the adjacent pairs and every N fingers 37 (e.g., every eight or sixteen fingers), one finger is missing to allow arrangement of the base contact regions 15, the biasing region 40 and the respective contacts 23 and 42. With this configuration, the cell size is $12F^2$.

Figure 8:
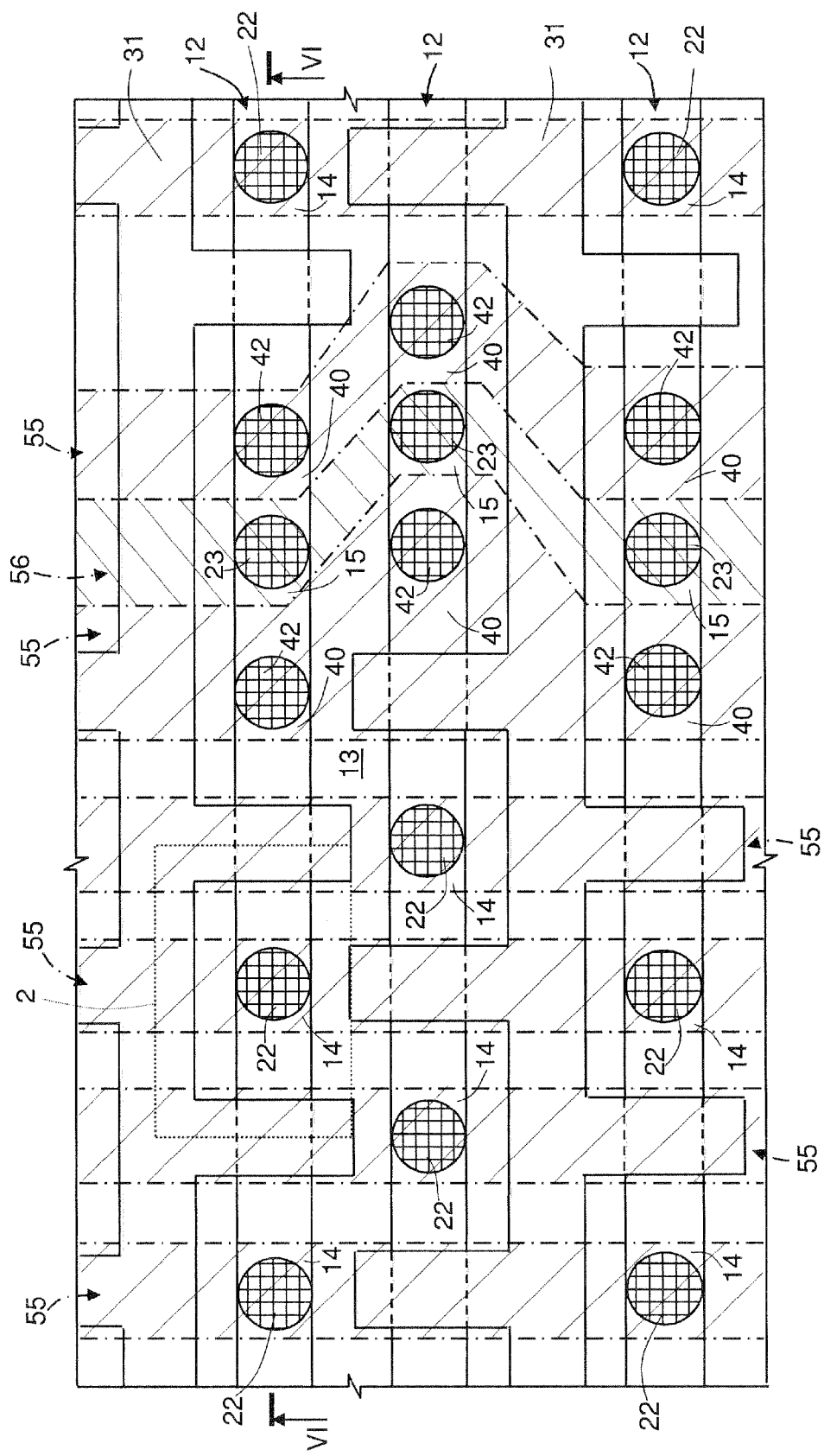

In FIG. 8, each polysilicon strip 31 comprise a rectilinear portion 36 with protruding fingers 37. Here, the protruding fingers are formed on each side of the rectilinear portion 36, with the fingers 37 on one side of a rectilinear portion being offset with respect to the fingers on the other side of the same rectilinear portion 36 by half pitch. Analogously, the facing fingers 37 of two adjacent polysilicon strip 31 are offset by half pitch. Also here, every N fingers 37, one is missing to allow arrangement of the base contact regions 15 and the respective second contacts 23. With this configuration, the cell size is $10F^2$.

With the embodiments of FIGS. 5-8, during programming, a cell 2 is selected by suitably biasing a bitline 25 and a wordline 26, thereby biasing the transistor 50 having emitter region 14 and base contact region connected thereto, through the respective first and second contacts 22, 23. Furthermore, the polysilicon strip 31 of the group of transistors 50 sharing the same base contact region 15 with the addressed transistor 50 are positively biased, to obtain the accumulation of negative charges in the underlying portion of the base region 12. Thus, the resistance of the base region 12 is reduced.

During reading, the polysilicon strips are biased to cause them to operate as gates of standard PMOS transistors. Furthermore, the biasing region 40 of the same block as the addressed cell 2 is biased through the biasing line 41 operating here as a wordline. In such a situation, the biasing region 40 operates as a source and forms, together with the adjacent portion of the polysilicon strip and the adjacent emitter region 14, a MOS transistor. Analogously, the emitter regions 14 along the same polysilicon strip 31 form a plurality of series-connected MOS transistors. The biasing of the polysilicon strip 31 associated with the addressed cell 2 with a negative voltage cause all the series-connected MOS transistors to switch on and the portion of the base region 12 underlying the polysilicon strip 31 to form a plurality of P channels, connecting the addressed biasing region 40 to all the emitter regions 14 of the same group of cells 2. Thereby, a low-resistance path forms between the emitter region 14 of selected cell 2 (now acting as a drain region) and the addressed biasing region 40, thus reducing the voltage drop. Therefore, the memory including the array 1 does not require the use of charge-pumps to boost the voltage, in some embodiments, thus, reducing the power consumption and improving the reading parallelism and the read throughput, still preserving the driving capabilities of the bipolar transistors 50 for programming.

Such solution, of course, uses a decoding circuit connected to the biasing lines 41, which replaces the wordlines 25 during reading.

Figure 9:
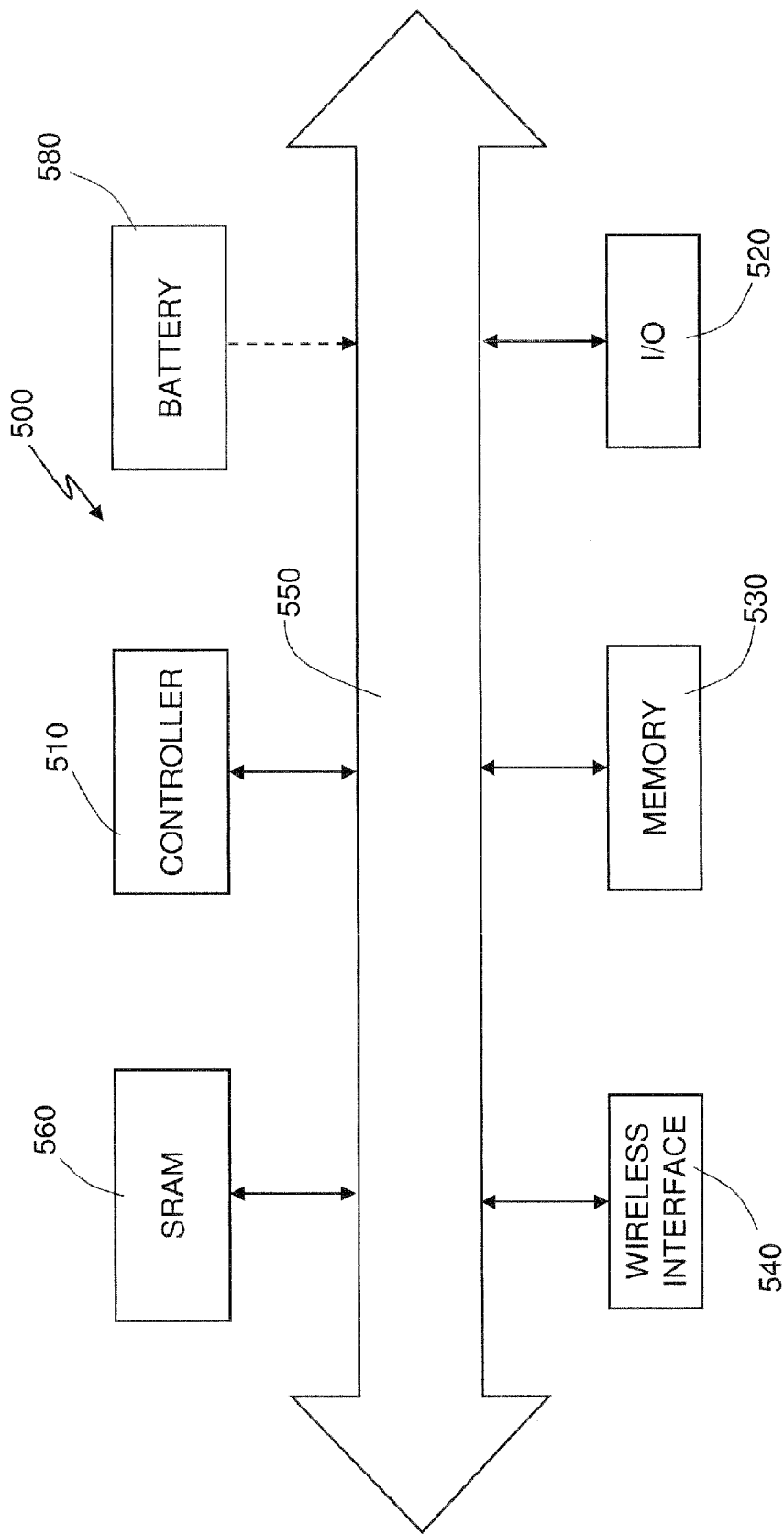
FIG. 9 is a system depiction for another embodiment of the invention.

Turning to FIG. 9, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g. a keypad, display), static random access memory (SRAM) 560, a memory 530, and a wireless interface 540 coupled to each other via a bus 550. A battery 580 is used in some embodiments. It should be noted that the scope of the present invention is not limited to embodiments having any or all of these components.

Controller 510 comprises, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a phase change memory including the memory array 1 discussed herein.

I/O device 520 may be used by a user to generate a message. System 500 uses wireless interface 540 to transmit and receive messages to and from a wireless communication network with a radio frequency (RF) signal. Examples of wireless interface 540 may include an antenna or a wireless transceiver, although the scope of the present invention is not limited in this respect.

The described embodiments may allow a reduction in the resistance along the base region 12 by virtue of the modified charge distribution caused by the biasing of the overlying biased polysilicon strips 31. The polysilicon strips 31 are also useful as suicide protection regions. In the embodiments of FIGS. 5-8, a compact hybrid selection structure may be obtained, which combines a MOSFET and a bipolar junction transistor.

Finally, it is clear that numerous variations and modifications may be made to the array and process described and illustrated herein, all falling within the scope of the invention as defined in the attached claims. For example, the same selection array may be used for selection of other storage elements, different from the chalcogenic storage elements 24, or of other two- or three-terminal elements that are compatible with standard CMOS back-end processes.

Furthermore, although the base contact regions 15 have been indicated throughout the description and in the drawings as separate N+ type regions, more doped than the base region 12, they can be absent, and the portion of the base regions 12 underlying the contact 42 form base contact portions. The term "base contact regions 15" is thus intended to encompass both situations.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a plurality of bipolar junction select transistors for a memory array;
   forming a shared control region in a semiconductor body for said transistors; and
   forming, on said body, a plurality of biasing structures to modify a charge distribution in said control region.

2. The method of claim 1 including implanting first regions in said shared control region, laterally to said biasing structures.

3. The method of claim 2 including forming, in the shared control region, control contact portions for said transistors.

4. The method of claim 3 including forming a common conduction region of a first conductivity type, the shared control region of a second conductivity type and a first doping level, the first regions of said first conductivity type, and the control contact portions are of said second conductivity type.

5. The method of claim 2 including forming contact portions of a second doping level, higher than said first doping level.

6. The method of claim 3 wherein forming a biasing structures including depositing a polysilicon layer on a gate insulator and defining said polysilicon layer to form polysilicon strips.

* * * * *